US008811102B2

United States Patent
Le et al.

(10) Patent No.: US 8,811,102 B2
(45) Date of Patent: Aug. 19, 2014

(54) MULTIPLE READ PORT MEMORY SYSTEM WITH A SINGLE PORT MEMORY CELL

(71) Applicant: International Business Machines Corporation, Armonk, NY (US)

(72) Inventors: Thoai Thai Le, Cary, NC (US); Jagreet S. Atwal, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 13/742,578

(22) Filed: Jan. 16, 2013

(65) Prior Publication Data

US 2014/0198595 A1 Jul. 17, 2014

(51) Int. Cl.
*G11C 7/12* (2006.01)
*G11C 7/22* (2006.01)

(52) U.S. Cl.
CPC ... *G11C 7/12* (2013.01); *G11C 7/22* (2013.01)
USPC ........................................ 365/203; 365/233.5

(58) Field of Classification Search
CPC .................................. G11C 7/12; G11C 7/22
USPC ............................................. 365/203, 233.5
See application file for complete search history.

(56) References Cited

U.S. PATENT DOCUMENTS

| | | | | |
|---|---|---|---|---|
| 5,485,422 | A * | 1/1996 | Bauer et al. | 365/185.21 |
| 6,707,712 | B2 * | 3/2004 | Lowery | 365/175 |
| 7,107,429 | B2 * | 9/2006 | Barlow et al. | 711/170 |
| 7,158,413 | B2 * | 1/2007 | Kasai et al. | 365/185.18 |
| 7,499,312 | B2 * | 3/2009 | Matick et al. | 365/154 |
| 7,656,739 | B2 | 2/2010 | Ham | |
| 7,755,938 | B2 * | 7/2010 | Atir et al. | 365/185.02 |
| 8,238,158 | B2 * | 8/2012 | Shelton et al. | 365/185.03 |
| 8,385,131 | B2 * | 2/2013 | Seol | 365/185.28 |
| 8,407,395 | B2 * | 3/2013 | Kim et al. | 711/100 |
| 8,441,857 | B2 * | 5/2013 | Lee | 365/185.18 |

* cited by examiner

*Primary Examiner* — Michael Tran
(74) *Attorney, Agent, or Firm* — Scully, Scott, Murphy & Presser, P.C.; H. Daniel Schnurmann (57) ABSTRACT

An improved multi-port register file system and method of operating. The multi-port register file memory system comprises: n single memory bit cells each storing a data value and having a single bit cell write port and a single read port connecting a respective local bit line, wherein corresponding parallel activated single bit cells output a stored data value in parallel at n read port outputs to a respective local bit line of n local bit lines, each single bit cell accessed in parallel according to a decoded read address signal. A receiver device is provided implementing n selection logic devices corresponding to n read ports, each selection logic device receiving each the n local bit line output values from the n single bit cells, and implementing logic based directly on the decoded read address signal to select a respective local bit line output as a global output bit.

25 Claims, 5 Drawing Sheets

MULTIPLE READ PORT MEMORY SYSTEM WITH A SINGLE PORT MEMORY CELL

BACKGROUND

The present disclosure generally relates to microprocessors and microprocessor memory systems, and more specifically, an apparatus and method for providing multiple read port memory system with a single port memory cell.

Microprocessors use memory arrays such as register files to store data temporarily for a processing unit. To enable simultaneous access to a memory cell array, register files are used to provide multiple read and/or write ports. Depending on application these so called multi-port register files can be configured up to eight or even more read ports.

Figure 2:
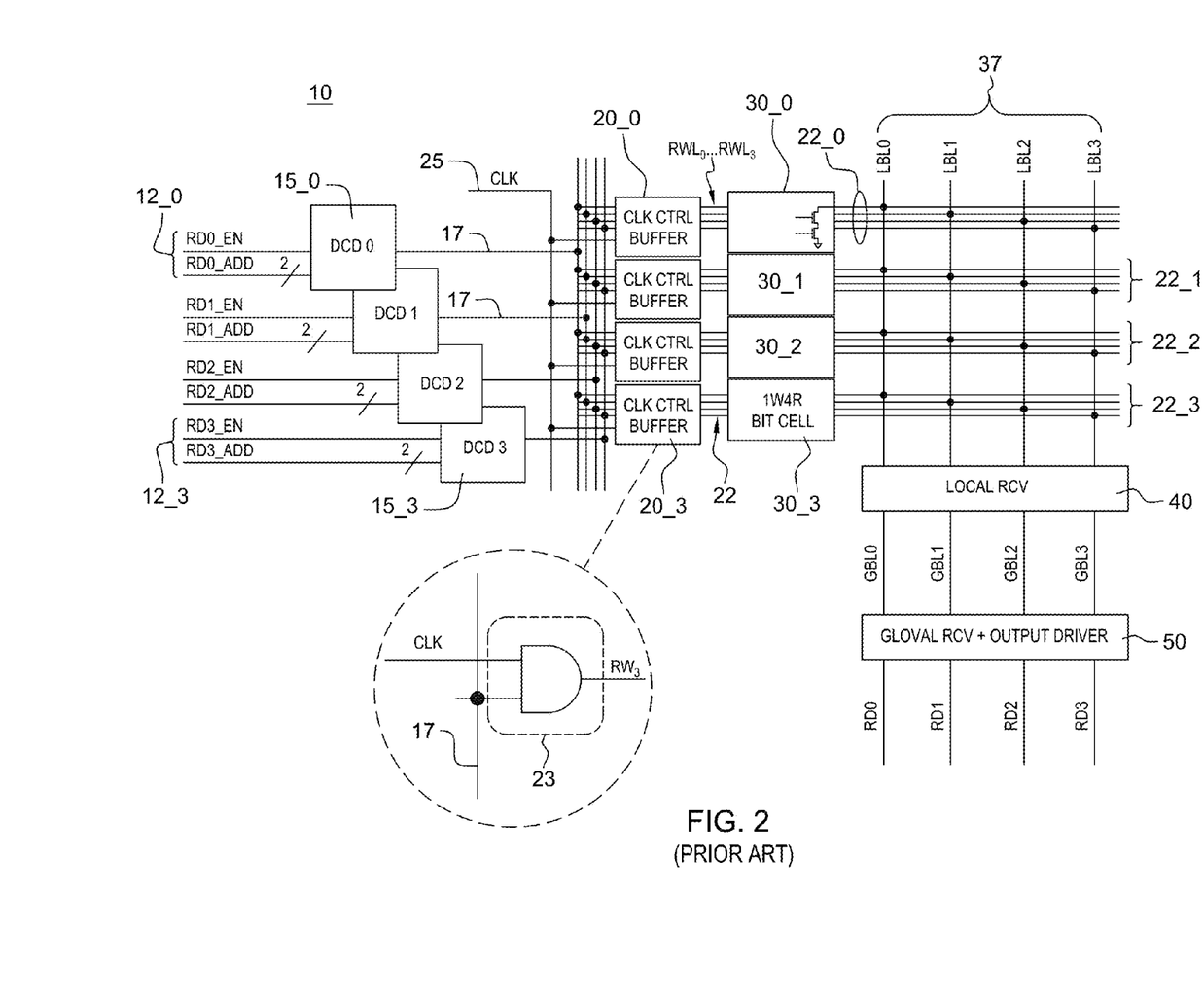
FIG. 2 illustrates a schematic block diagram of a conventional 1W4R register file 10 with 1W4R port bit cell implementing the single bit cell.

FIG. 2 illustrates a block diagram of a conventional (1 Write, 4 Read) 1W4R register file 10. While an address read architecture is depicted, it is understood that a write word line configuration (not shown) uses a similar architecture as known in the art. In the read word line implementation, the 1W4R register file 10 provides four read Address Decoder elements $DCD_0, \ldots, DCD_3$ elements 15_0, ... 15_3 respectively, for each of the four read ports 1W4R (1 Write, 4 Read) port bit cells 30_0, ..., 30_3 respectively. Each respective decoder element 15_0, ... 15_3 receives a respective read enable bit decoder selector signal and respective read address bits, (e.g., 2 bits) collectively at respective read address bit input lines 12_0, ... 12_3. When enabled, the decoder element 15_0, ..., 15_3 generates, in response to the 2 read address inputs, respective parallel output read address decode bits 17 on a bus. In the implementation shown, a 2:4 read address decoder element 15_0, ..., 15_3 provides an output of four read address decode bits 17. As further shown in FIG. 2, a corresponding clock control buffer device 20_0, ..., 20_3 is provided to receive the four read address output bits 17 of the respective enabled decoder element 15_0, ..., 15_3. The inset of FIG. 2 shows a detailed processing at a clock control buffer element 20_3 where a received decoder parallel output bit 17 is combined using an AND or similar logic gate 23, with a read control clock signal 25 to clock in the four parallel read address decode signals, referred to as $RWL_0, \ldots, RWL_3$ 22 in a read operation. A respective set 22_0, ..., 22_3 of Read Word Line ($RWL_0, \ldots, RWL_3$) signals is input to a respective 1W4R port bit cell 30_0, ..., 30_3 to selectively read the data value stored therein. Each Read Word Line signal 22 is received at a respective read port pass gate circuit to drive the corresponding output bit cell value (e.g., truth or its complement) at a corresponding local bit line 37. Read output data on the local bit line $LBL_0, \ldots, LBL_3$ are output as register file 10 outputs RD0-RD3 via processing at respective local receiver element 40 and global receiver and output driver element 50.

A write word line implementation for writing data to a register file is also provided using a similar structure. In the case of write operations (not shown), the same structures are implemented, i.e., a write enable bit, and write address bits (not shown) are input to a respective write decoder (not shown) where the outputs are gated, using a clock (CLK) control buffer and bit cell to generate write bits, e.g., Write Word Line (WWL) bits for performing a 1W4R bit cell write operation.

Depending on an application, a multi-port register file can be configured up to eight or more read ports.

Figure 1:
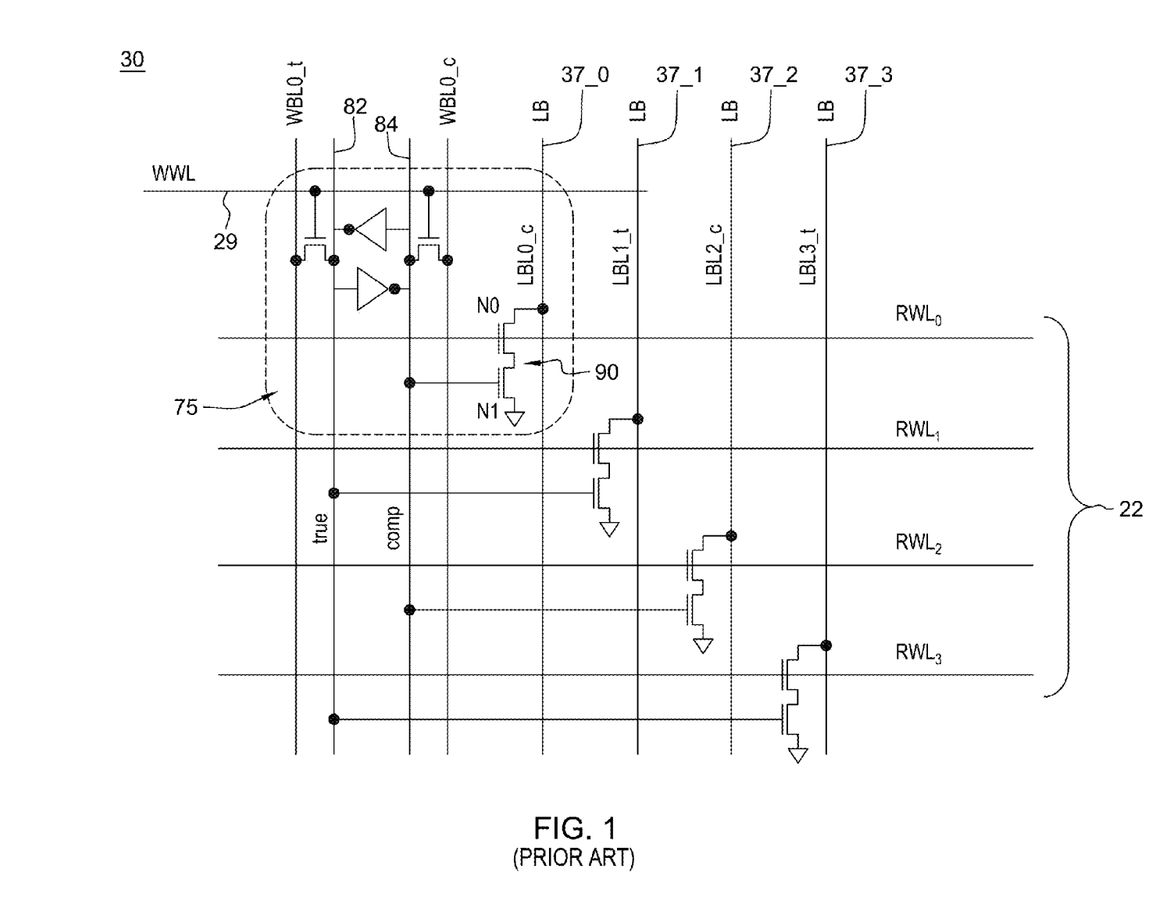
FIG. 1 shows a schematic diagram of a conventional bit cell with one write port and four read ports (1W4R) implementing a single 1W1R bit cell.

FIG. 1 shows a detailed schematic diagram of a conventional 1W4R port bit cell circuit 30 (representing a single 1W4R circuit 30_0, ..., 30_3 of FIG. 2). Each bit cell 30 includes one write port and four read ports and implements a single memory bit cell (single bit cell) 75 of a conventional 6-transistor memory bit cell design implementing a cross-coupled inverter configuration and includes a single read port.

As shown in FIG. 1, to write data to single bit cell 75, input Write Word Line (WWL) 29 receives decoded write signal from write decode circuitry (not shown) to activate storing a data value at respective bit cell node 82 and complementary bit cell node 84 of the bit cell 75 in conjunction to data value inputs WBL0_t (e.g., write bit line 0 true data value) and WBL0_c (e.g., write bit line 0 complement data value). For example, a low or "0" value WWL signal may represent a bit cell hold operation, while a high or logic "1" value WWL signal may represent a bit cell write operation.

In FIG. 1, at each local bit line LBL0, ..., LBL3 corresponding to local bit lines $37_0, \ldots, 37_3$, there is connected a pass gate selection circuit 90 comprising a serial configuration of parallel operated pull-down NMOS FET devices N0, N1. Data values at LBL0, ... LBL3 are read out under control of NMOS device N0 coupled to a respective read word line $RWL_0, \ldots, RWL_3$ that each receive decoded address signals to drive the respective read bit lines $37_0, \ldots, 37_3$ to its true (or complementary) values based on the data written to and stored at the bit cell nodes 82 (84). For each read port, a data value stored at a single bit cell node 82 or 84 is read out by a corresponding NMOS transistor device N1 whose gate is connected to the corresponding cell node. In the example circuit 30 of FIG. 1, a local bit line data value corresponding to a true value is read from read bit lines LBL1_t and LBL3_t of 1W4R bit cell circuit, and its complement value is provided at complement read bit lines LBL0_c, LBL2c. Read bit lines LBL0, ... LBL3 are usually pre-charged to high values, e.g., in a pre-charge phase using a local_prch signal 42 (i.e., local_prch=0) until the bit cell 75 drives the bitline high or low according to the stored bit cell data value in the evaluation phase of a read process (local_prch=1).

Selection circuits (i.e., N0, N1 pass gates) can be added as many as read ports are needed. However, additional register file cell circuitry and wire lines are required taking up much more chip area.

Figure 3:
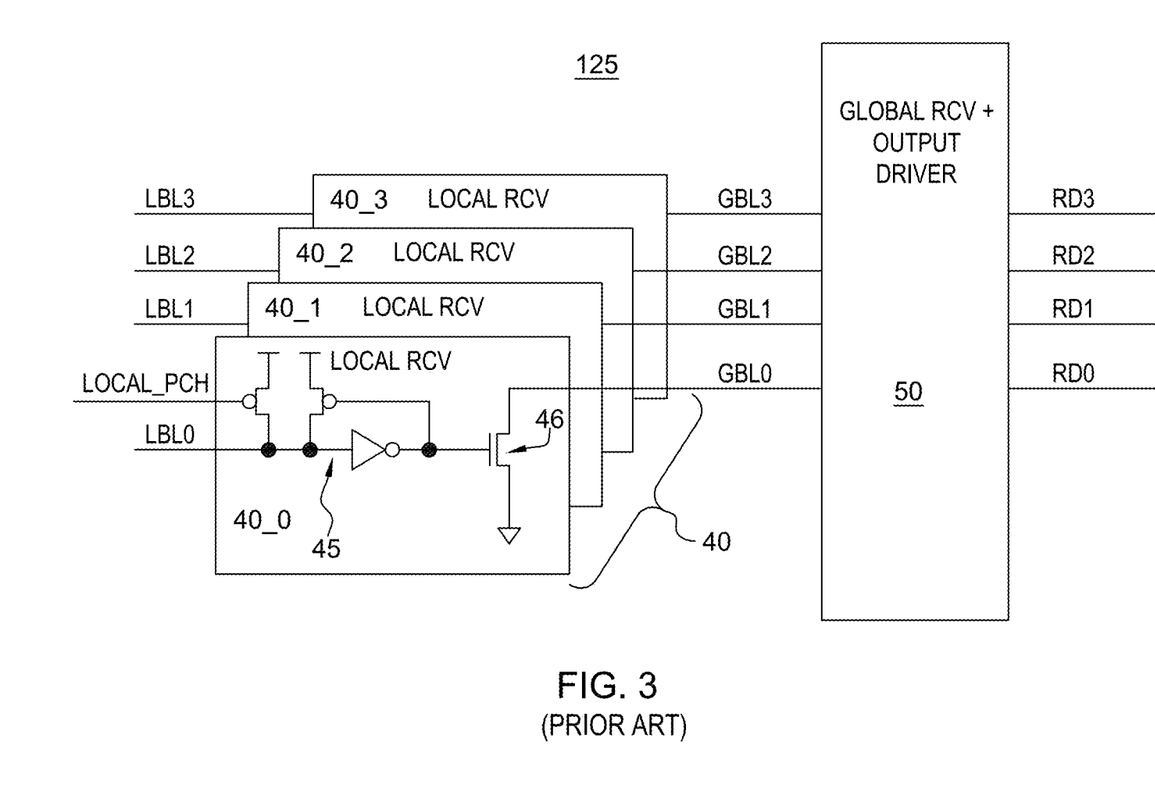
FIG. 3 depicts a further conventional circuit 125 for reading out data values from 1W4R port register file.

FIG. 3 depicts a further conventional circuit 125 for reading out data values from 1W4R port register file 30 of FIG. 1. This read process occurs in two stages via the local receiver circuits 40 and global receiver and output driver circuits 50. When selected, read data for each port is driven from the cell nodes to the local bitline (LBL0, ..., LBL3) and fed to the corresponding local receiver 40_0, ..., 40_3 which in turn drives the data on respective lines global bit lines GBL0, ..., GBL3 through the global receiver 50 provide the read data output RD0-RD3 in parallel. As known in the art, each local receiver $40_0, \ldots, 40_3$ includes an inverter as amplifier, pull-up transistor devices (pre-charge and keeper) 45 and a, NMOS transistor device 46 in a pull-down configuration at the local receiver for driving the read local bitline data values on respective lines global bit lines $GBL3_0, \ldots, GBL_3$ for receipt at the global receiver 50.

One drawback of the conventional multi-port register file architecture 10 of FIG. 2, is that cell area and the wire pitch area increases typically linearly to the number of the read ports. While growing cell height is not an issue, increasing in width is in general strictly limited due to a predefined standard cell pitch.

Furthermore, bit cell layout design is very challenging with increasing number of ports. Being located in a very congested area, it is very likely that a multi-port bitcell may exhibit more crosstalk coupling occurring between adjacent bitlines and word lines.

Further, with the additional loading on each of the storage nodes (true/comp), read/write access times increases accordingly to the number of the ports.

Furthermore, as there is one decoder for each read port, the decoded address is combined with the read clock in the clock control buffer to generate the read word lines. As indicated in FIG. 2 wiring becomes more and more complex in this particular region with increasing number of read ports.

It would be highly desirable to provide a more area efficient register file with multiple read ports, and a method for operating the register file, that avoids the drawbacks of the conventional multi-port cell architecture.

BRIEF SUMMARY

There is provided, in one aspect, a register file circuit with multiple read ports using a single port memory bit cell that avoids the drawbacks the conventional multi-port register file implementations.

In one aspect, there is provided a register file with multiple read ports and method of operating. The register file with multiple read-ports comprises: n single memory bit cells where n is an integer equal to or greater than 2, each single memory bit cell storing a data value and providing a respective a single bit cell write port and a respective single read port connecting a respective local read bit line for transmitting the stored data value when accessed, wherein each the n single memory bit cell accessed in parallel to output a corresponding stored data value at a corresponding single read port in parallel at a respective local read bit line according to decoded address bits; and n selector devices, each selector device corresponding to a single memory bit cell and each simultaneously receiving a respective stored single bit cell data value transmitted on a respective local read bit line, in parallel, from each the accessed single memory bit cell, each selector device implementing selection logic based directly on the decoded address bits to select a respective local bit line output providing a stored single bit data value corresponding to the accessed single read port.

Further to this aspect, the register file further comprises n decoder devices, a decoder device corresponding to a single bit cell and configured to receive predetermined bit signals of a read port memory address and an enable signal, a decoder device of the n decoder devices being selected by the enable signal to generate the decoded address bits corresponding to the predetermined bit signals.

Furthermore, the register file further comprises: n clock control buffer devices, a clock control buffer device corresponding to a respective decoder device, each clock control buffer device for receiving the decoded address bit signals in parallel, and implementing logic to generate a respective output read word line signal, each the output read word line signal being input to a corresponding single bit memory cell for accessing the corresponding single bit cell.

Further, the register file comprises: n clock control buffer devices, a clock control buffer device corresponding to a respective decoder device, each clock control buffer device for receiving said decoded address bit signals in parallel, and implementing logic to generate a respective output read word line signal, each said output read word line signal being input to a corresponding single bit memory cell for accessing said corresponding single bit cell.

Further, a receiver device is coupled to receive from each local read bit lines the single bit cell data values transmitted in parallel from each accessed single memory bit cell read port, the receiver device simultaneously providing the data transmitted on each the respective local read bit line as inputs to each of the selector devices, each individual selector device selected based on the decoded address bits and the enable signal to generate a corresponding register file read port output bit.

Further to this aspect, each selector device comprises a n:1 multiplexer logic device for simultaneously receiving the read port data values on the local read bit lines, and a selector means associated with each n:1 multiplexer logic device for selecting one of the local bit line data values as a corresponding register file read port output bit of a corresponding multiplexer logic device based on the generated decoded address bit signals and the enable signal.

In one embodiment, a method of operating an n-port register file is provided where n is an integer equal to or greater than 2. The n-port register file includes n single memory bit cells each storing a single bit value and having a single bit cell write port, and a single read port connecting a respective local read bit line for outputting the stored data value when accessed. The method comprises: activating, in response to a register file read request, each n single memory bit cell in parallel to output a corresponding stored data value at a corresponding single read port for output in parallel at a respective local read bit line according to decoded address bits; simultaneously receiving, at each of n selector devices corresponding to the n single memory bit cells, the respective stored single bit cell data values transmitted on a respective local read bit line in parallel from each the accessed single memory bit cell; and implementing selection logic based directly on the decoded address bits at each of the n selector devices to select a respective local bit line output providing a stored single bit data value corresponding to the accessed single read port.

Further to this embodiment, the method comprises: simultaneously receiving, at each of n decoder devices, predetermined bit signals of a read port memory address and an enable signal, one of the n decoder devices being selected by the enable signal to generate the decoded address bits corresponding to the predetermined bit signals.

Further, the method comprises: receiving the decoded address bits in parallel at each respective clock control buffer device of n clock control buffers devices, and implementing logic at each clock control buffer device to generate a respective output read word line signal, each the output read word line signal being input to a corresponding single bit memory cell for accessing the corresponding single bit cell.

The method further comprises: transmitting single bit cell data values in parallel from each the accessed single memory bit cell read port on respective the local read bit lines to each the n selector devices; and simultaneously receiving, at each the selector device, each the transmitted single bit cell data values from the local read bit lines, wherein the implementing logic at each the n selection logic device comprises: selecting, based on the decoded address bits and the enable signal, an individual selector device to generate a corresponding register file read port output bit; and generating, at each selected selector device, a corresponding register file read output bit according to received the decoder read address signals.

BRIEF DESCRIPTION OF THE SEVERAL VIEWS OF THE DRAWINGS

The objects, features and advantages of the present invention will become apparent to one of ordinary skill in the art, in view of the following detailed description taken in combination with the attached drawings, in which.

DETAILED DESCRIPTION

The present disclosure relates to a microprocessor register file circuit architecture including a novel multi-port register file memory array implementation with multiple single 1-Write 1-Read (1W1R) port cells (single bit cells), and a method of using the same. Aspects of the present disclosure are now described in detail with accompanying figures. It is noted that like reference numerals refer to like elements across different embodiments.

Figure 4:
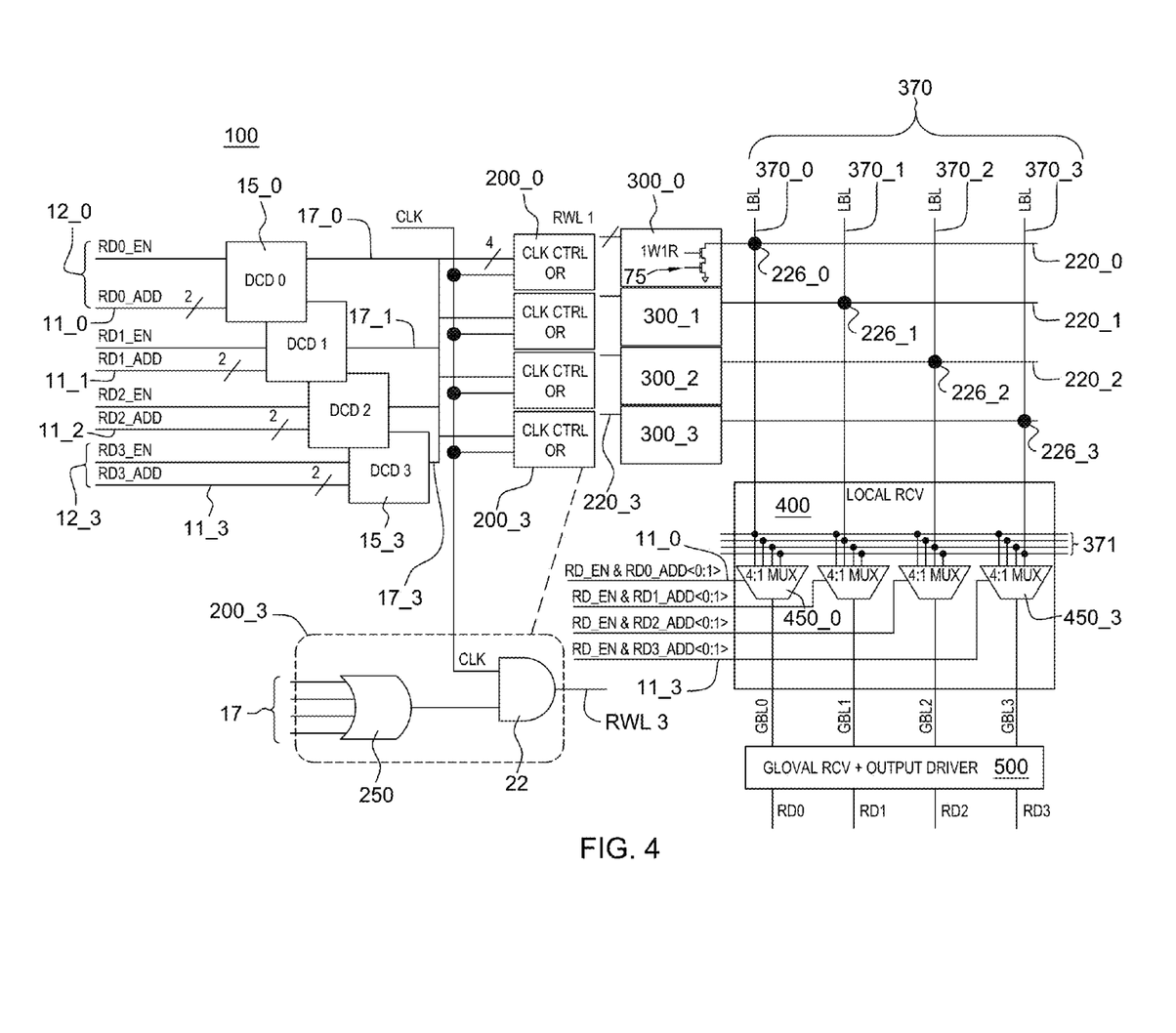
FIG. 4 illustrates an exemplary embodiment of a multiple-port memory array circuit.

In one aspect, there is provided an n-port register file memory array 100 illustrated in FIG. 4. For purposes of illustration, n=4, such that the multi-port memory array 100 includes an implementation of 4-read ports as four single bit cells (e.g., four 1-Write 1-Read (1W1R) port cells 300_0, ..., 300_3). It is understood that for the embodiments described herein, each single bit memory cell may include multiple read ports, such that the single bit cells may include a xW1R cell with x=0, 1 ..., N.

In one embodiment, multi-read port memory array 100 implements respective read address decoders 15_0, ..., 15_3 each generating, when enabled, n decoder read address bit signals (decoder read address signal). In one embodiment depicting 4-port memory array, each read address decoder 15_0, ..., 15_3 is a 2:4 address decoder, that, when enabled, generates in response to the 2 read address inputs, four output decoder read address signals 17 provided in parallel on each of respective conductors, such as respective data bus lines 17_0, ... 17_3. The generated four read address decode bits 17 are based on a respective received single read enable signal and two read address bit signals 12_0, ..., 12_3.

As further shown in FIG. 4, a corresponding clock control buffer device 200_0, ..., 200_3 corresponding to each read port is provided to receive the four decoder read address signals (outputs) 17 on the bus of the respective enabled decoder element 15_0, ..., 15_3. As shown in the inset detail of FIG. 4, depicting clock control buffer device operation, in each corresponding clock control buffer device 200_0, ..., 200_0, there is received in parallel decoded address bits 17 of the four read ports are ORed together by an OR logic gate 250, and the output of the OR gate is gated the clock signal 25 using AND gate 260 to form a single Read Word Line (e.g., $RWL_0$) value. Thus, each clock control buffer 200_0, ..., 200_3 clocks a respective single read word line, referred to as $RWL_0$, ..., $RWL_3$ in parallel, to a respective 1W1R cell 300_0, ..., 300_3. Access to the respective 1W1R cell 300_0, 300_3 is therefore only address based and independent from which read port they are coming.

Upon clocking in the respective $RWL_0$, ... $RWL_3$ to provide the respective stored data value outputs 220_0, 220_3 generated at each 1W1R cell 300_0, ..., 300_3, are provided as output at each respective local bit line LBL0, ... LBL3.

That is, once accessed, the content of the addressed cell is transferred to the local bit lines LBL 370_0, ..., 370_3.

In one implementation implementing 2:4 read address decoding, as shown in FIG. 4, data accessed at a respective single bit cell output 220_0, ..., 220_3 is respectively conducted to a corresponding local bit line LBL 370_0, ..., 370_3 via respective conductive crossing point connections 226_0, ..., 226_3 where they are each received and amplified in a local receiver device 400. For the embodiment depicted in FIG. 4, a data value read from single bit cell 300_0 is output to a corresponding local bit line LBL 370_0 via conductive connection 226_0; a data value read from single bit cell 300_1 is output to a corresponding local bit line LBL 370_1 via conductive connection 226_1, etc.

Then, given n=4 read ports implementation, with 4 outputs at each of the four 1W1R bit cells, the register file circuitry makes a decision as to which port gets activated. A read address defines which cell is to be read, i.e., a local bit line is selected to provide the respective global bit line output for each cell. A 4:1 selector circuit is provided to select one of the LBL lines depending upon what address and which read port is being read.

In one embodiment, local receiver device 400 includes a selector logic device for selecting from among received local bit line LBL outputs 370_0, ..., 370_3 which is to be driven as output global read signals GBL0, ..., GBL3 to global receiver and output driver 500. Selector logic device includes, in one embodiment, a 4:1 multiplexer (MUX) device 450_0, ..., 450_3 corresponding to a register filed read port. For n multiple read ports, there are corresponding n multiplexer devices with each implementing an n:1 selection logic.

Each 4:1 multiplexer device 450_0, ..., 450_3 performs assigning the local bitline LBL data to the register file output according to the activated read port/address.

In the embodiment of FIG. 4, each MUX device 450_0, ..., 450_3 receives the respective single bit cell 300_0, ..., 300_3 outputs on respective local bit lines LBL 370_0, ..., 370_3. In FIG. 4, each LBL bit line 370_0, ..., 370_3 is input to each MUX device via a matrix of further conductive crossing point connections 227 that connect a set of conductive lines 371 with LBL bit lines 370_0, ..., 370_3 from which each respective MUX device 450_0, ..., 450_3 receives LBL bit line inputs.

Figure 5:
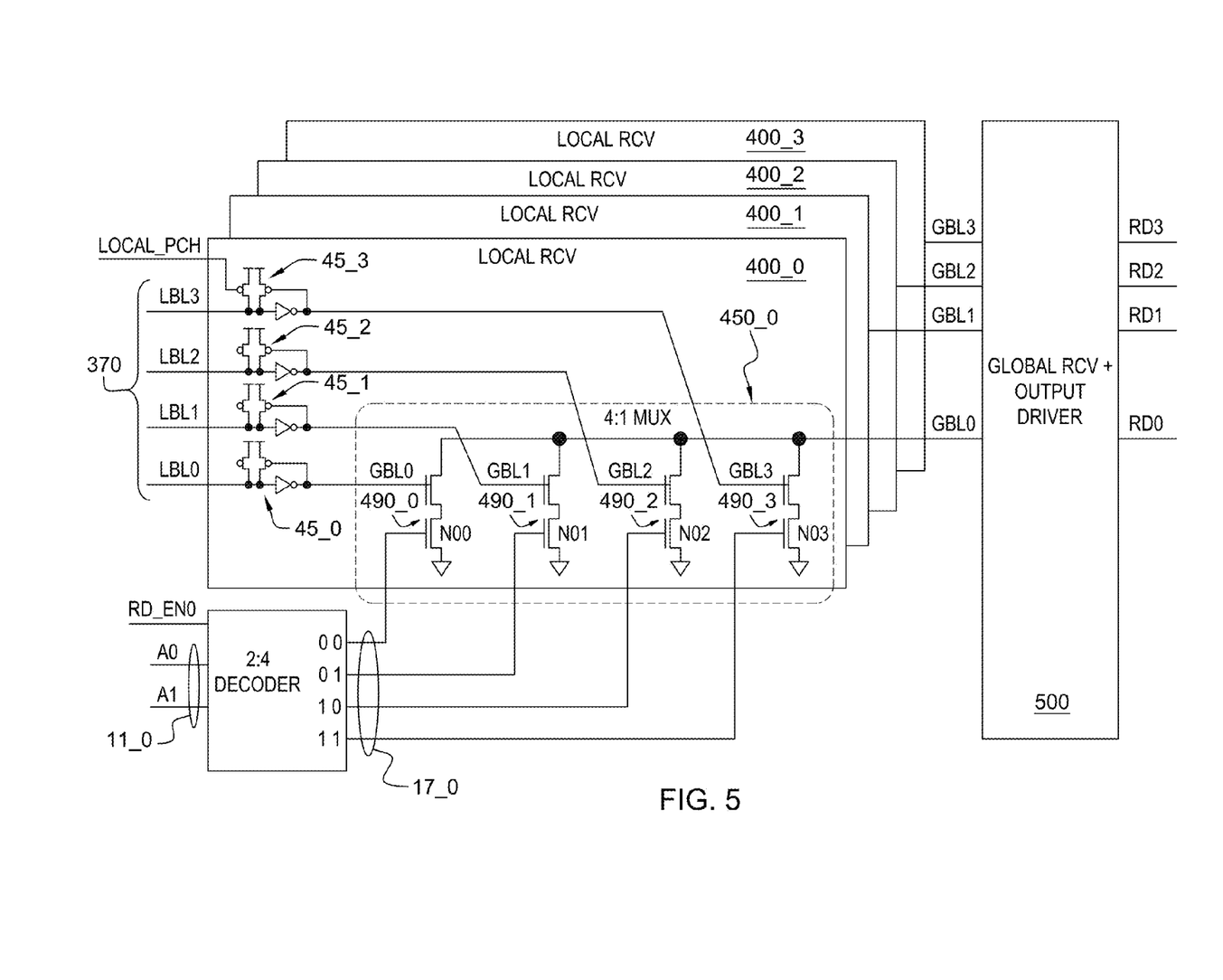
FIG. 5 illustrates one embodiment of a local receiver device of the multiple-port memory array circuit implementing a 4:1 multiplexer selection device.

In one embodiment, each 4:1 multiplexer device 450_0, ..., 450_3 can be implemented with standard logic gates. FIG. 5 illustrates one embodiment of a respective local receiver device 400_0, ..., 400_3 each implementing respective multiplexer logic device 450_0, ..., 450_3. In one embodiment, FIG. 5, shows a representative single local receiver device 400_0 receiving LBL data on respective local bit lines LBL 370_0, ..., 370_3 at a single multiplexer logic device 450_0 that selects data of a single LBL 370_0, ..., 370_3 as output global read signal line GBL0 according to a decoded read address. In one embodiment, multiplexer logic device 450_0 is configured by adding selection transistors (N00 ... N03) in a pass gate configuration to the existing pre-charge circuit pull-up transistors in the local receiver. For example, in local receiver device 400_0, each input local bit line 370_0, ..., 370_3 may be pre-charged with pull-up transistors 45_0, ..., 45_3 which connect to global read signal line GBL0 via respective gate pull down transistor 490_0, ..., 490_3. Depending upon decoded read address, each multiplexer logic device $450_0$ is configured to select, under control of added respective selection transistor N00 ... N03 in a pass gate configuration, the respective gate pull down transistor 490_0, ..., 490_3, to provide data at corresponding local bit line value 370_0, ..., 370_3 as the global read signal line GBL0 output data.

Assigning the data to the corresponding read port is carried out by a decoder whose inputs are the read enable and the least significant address bits of each read port. In one embodiment, this may include two least significant address bits of a read port, e.g., (0, 0), (0, 1), (1, 0), and (1, 1). This 2-bit decoder can be or include the main read decoder, e.g., decoder 15_0, ..., 15_3 one of which, e.g., decoder 15_0 is shown in shown in FIG. 4, or implement additional logic located in the same decoder area. Thus, in one implementation, output decode address signals 17 of each respective decoders 15_0, ..., 15_3 are used to control the respective 4:1 MUX 450_0, ..., 450_3 at a respective receiver device which selects the particular local bit line data value from the 4 local bit lines input.

In view of FIG. 4, an example implementation is now described: given RD0_EN is a value of "1" and all other inputs (RD**_ADD, RD*_EN) to the decoder are "0". This means that read port 0 has been activated, so the logic in clk control buffer 200_0 and in the single bit cell 300_0 is active. Assuming that value stored in the single bit array cell 300_0 leads to LBL0 getting discharged to "0". Note that all the other LBL signals (e.g., LBL_1, LBL_2, LBL_3) will stay pre-charged. The local receiver providing a 4:1 multiplexer ("MUX") device 450_0 will become active. In FIG. 5, the N00 transistor will be "on", while all the other MUX devices (e.g., 450_1, 450_2, 450_3 will be inactive. The GBL0 bitline will get discharged since that port is active, while all the GBL1, GBL2, and GBL 3 will stay in their pre-charged state.

Thus, in one aspect, a system and method that provide a register file with multiple read ports by using a single port memory bit cell as opposed to conventional multi-port cell architecture. More generally, a register file memory array 100 having n read ports is configurable, where single (1W1R port) bit cell is used. A decoder device in this implementation may provide decoders providing n decoder address bits, each decoder address bit corresponding to a single read port. In one implementation, a 2:4 read address decoder device provides n=4. Any multi-port register file configuration is possible with n ranging from n>2 (e.g., n=4, 8, or greater).

Advantages of the register file apparatus with multiple read ports using multiple single (1W1R port) memory bit cells and a method for operating such register file apparatus include: 1) a significant reduction of cell area per bit cell as only one read port is required; 2) compared to a macro using a four read port cell, area reduction between 15 and 20% for a large register file with 128 entries can be expected; and 3) a simplification of vertical wire routing in the cell array region results thus reducing coupling noise.

Further, complex routing is shifted from the congested bit cell region to local receiver(s). Moreover, the limitation of vertical lines is no longer an issue as complex routings are now shifted to the more relaxed horizontal direction.

While there has been shown and described what is considered to be preferred embodiments of the invention, it will, of course, be understood that various modifications and changes in form or detail could readily be made without departing from the spirit of the invention. It is therefore intended that the scope of the invention not be limited to the exact forms described and illustrated, but should be construed to cover all modifications that may fall within the scope of the appended claims.

The invention claimed is:

1. A register file with multiple read ports comprising:
    n single memory bit cells where n is an integer equal to or greater than 2, each single memory bit cell storing a data value and providing a respective single read port connecting a respective local read bit line for transmitting the stored data value when accessed, each said n single memory bit cells accessed in parallel to output a corresponding stored data value at a corresponding single read port in parallel at a respective local read bit line according to decoded address bits; and
    n selector devices, each selector device corresponding to a single memory bit cell and each simultaneously receiving a respective stored single bit cell data value transmitted on a respective local read bit line, in parallel, from each said accessed single memory bit cell, each selector device implementing selection logic based directly on said decoded address bits to select a respective local bit line output providing a stored single bit data value corresponding to said accessed single read port.

2. The register file as claimed in claim 1 further comprising:
    n decoder devices, a decoder device corresponding to a single bit cell and configured to receive predetermined bit signals of a read port memory address and an enable signal, a decoder device of said n decoder devices being selected by said enable signal to generate said decoded address bits corresponding to said predetermined bit signals.

3. The register file as claimed in claim 2 further comprising:
    n clock control buffer devices, a clock control buffer device corresponding to a respective decoder device, each clock control buffer device for receiving said decoded address bit signals in parallel, and implementing logic to generate a respective output read word line signal, each said output read word line signal being input to a corresponding single bit memory cell for accessing said corresponding single bit cell.

4. The register file as claimed in claim 3 wherein each clock control buffer device comprises: an OR logic gate device receiving each said decoded address bit signals in parallel and generating an output read word line signal based on said decoded address bits; and
    an AND logic gate device receiving a read control clock signal to provide said output read word line signal to activate a read port of each corresponding single bit cell, whereby each single bit cell is activated to provide a stored data value on a respective local bit line output.

5. The register file as claimed in claim 3 further comprising:
    a receiver device coupled to each respective local read bit line to receive single bit cell data values transmitted in parallel from each said accessed single memory bit cell read port, said receiver device simultaneously providing said data transmitted on each said respective local read bit line as inputs to each said n selector devices,
    each individual selector device selected based on said decoded address bits and said enable signal to generate a corresponding register file read port output bit.

6. The register file as claimed in claim 5, wherein each selector device comprises a n:1 multiplexer logic device for simultaneously receiving said read port data values on said local read bit lines, said register file further comprising:
    a selector means associated with each n:1 multiplexer logic device for selecting one of said local bit line data values as a corresponding register file read port output bit of a corresponding multiplexer logic device based on said generated decoded address bit signals and said enable signal.

7. The register file as claimed in claim 6, further comprising at said receiver device:
   a local bit line pre-charge circuit for pre-charging each said local read bit line;
   a corresponding first pass gate transistor connected to a corresponding said local bit line activated to select a respective one local bit line data value as said register file read port output bit, and
   a corresponding second pass gate transistor connected to a corresponding said first pass gate transistor for controlling output of said register file read port output bit value responsive to said associated selector means.

8. The register file as claimed in claim 7, wherein said associated selector means comprises:
   a respective address decoder associated with a corresponding multiplexer logic device, said address decoder providing said decoder address signals for activating said second pass gate transistor to control output of said register file port output bit value at said receiver.

9. The register file as claimed in claim 2, wherein n=4 and each said n decoder devices is a 2:4 address decoder adapted to receive one enable signal and two said predetermined bit signals of a read port memory address and generate four said decoder address bits when enabled.

10. The register file as claimed in claim 9, wherein the two said predetermined bit signals correspond to least significant address bits of a register file read port.

11. The register file as claimed in claim 1, wherein each single memory bit cell provides one or more write ports.

12. A method of operating an n-port register file having n single memory bit cells each storing a single bit value and having a single read port connecting a respective local read bit line for outputting the stored data value when accessed, where n is an integer equal to or greater than 2, said method comprising:
   activating, in response to a register file read request, each said n single memory bit cell in parallel to output a corresponding stored data value at a corresponding single read port for output in parallel at a respective local read bit line according to decoded address bits;
   simultaneously receiving, at each of n selector devices corresponding to said n single memory bit cells, said respective stored single bit cell data values transmitted on a respective local read bit line in parallel from each said accessed single memory bit cell; and
   implementing selection logic based directly on said decoded address bits at each of said n selector devices to select a respective local bit line output providing a stored single bit data value corresponding to said accessed single read port.

13. The method as claimed in claim 12 further comprising:
   simultaneously receiving, at each of n decoder devices, predetermined bit signals of a read port memory address and an enable signal, one of said n decoder devices being selected by said enable signal to generate said decoded address bits corresponding to said predetermined bit signals.

14. The method as claimed in claim 13 further comprising:
   receiving said decoded address bits in parallel at each respective clock control buffer device of n clock control buffers devices, and
   implementing logic at each clock control buffer device to generate a respective output read word line signal, each said output read word line signal being input to a corresponding single bit memory cell for accessing said corresponding single bit cell.

15. The method as claimed in claim 14 wherein said generating a respective output read word line signal at a clock control buffer comprises:
   receiving, at an OR logic gate device, each said decoded address bit signal and generating an output read word line signal based on said decoded address bits; and
   receiving, at an AND logic gate device, a read control clock signal to provide said output read word line signal to activate a read port of each corresponding parallel single bit cell, whereby each single bit cell is activated to provide a stored data value on a respective local bit line output.

16. The method as claimed in claim 14 further comprising:
   transmitting single bit cell data values in parallel from each said accessed single memory bit cell read port on respective said local read bit lines to each said n selector devices; and
   simultaneously receiving, at each said selector device, each said transmitted single bit cell data values from said local read bit lines, wherein said implementing logic at each said n selection logic device comprises:
   selecting, based on said decoded address bits and said enable signal, an individual selector device to generate a corresponding register file read port output bit; and
   generating, at each selected selector device, a corresponding register file read output bit according to received said decoder read address signals.

17. The method as claimed in claim 16, wherein each selector device comprises a n:1 multiplexer logic device for simultaneously receiving said accessed read port data values on said local read bit lines from each said single bit cell, said implementing selection logic comprising: at each said multiplexer logic device,
   selecting, at each of said n selector devices, one of said local bit line data values to provide a single corresponding register file read output bit at each multiplexer logic device based directly on said decoded address bits and said enable signal.

18. The method as claimed in claim 17, further comprising:
   pre-charging, using a local bit line pre-charge circuit, each said local read bit line.

19. The method as claimed in claim 18, wherein each said selector device comprises a corresponding first pass gate transistor connected to a corresponding said local bit line, and a respective second pass gate transistor connected to said first pass gate transistor for controlling outputting of said read port output data value responsive to a selector signal, said method comprising:
   activating a respective second pass gate transistor to select, based on said decoder read address bits and enable signal, a respective one local bit line data value for a register file port output bit.

20. The method as claimed in claim 19, further comprising: providing, by an address decoder device associated with a corresponding multiplexer logic device, said decoder address signals for activating said second pass gate transistor to control output of said register file port output bit.

21. A multiple read port memory system for a processor device, comprising:
   n single memory bit cells where n is an integer equal to or greater than 2, each single memory bit cell storing a data value and providing a respective single read port connecting a respective local read bit line for transmitting the stored data value when accessed,
   n decoder devices, a decoder device corresponding to a single bit cell and configured to receive predetermined bit signals of a read port memory address and an enable signal, a decoder device of said n decoder devices being selected by said enable signal to generate said decoded address bits corresponding to said predetermined bit signals;

n clock control buffer devices, a clock control buffer device corresponding to a respective decoder device, each control buffer device for receiving said decoded address bit signals in parallel, and implementing logic to generate a respective output read word line signal, each said output read word line signal being input to a corresponding single bit memory cell for accessing said corresponding single bit cell, wherein each said n single memory bit cell is accessed in parallel to output a corresponding stored data value at a corresponding single read port in parallel at a respective local read bit line according to decoded address bits; and n selector devices, each selector device corresponding to a single memory bit cell and each simultaneously receiving a respective stored single bit cell data value transmitted on a respective local read bit line, in parallel, from each said accessed single memory bit cell, each selector device implementing selection logic based directly on said decoded address bits to select a respective local bit line output providing a stored single bit data value corresponding to said accessed single read port.

22. The system as claimed in claim 21 further comprising:
a receiver device coupled to each respective local read bit line to receive single bit cell data values transmitted in parallel from each said accessed single memory bit cell read port, said receiver device simultaneously providing said data transmitted on each said respective local read bit line as inputs to each said n selector devices, each individual selector device selected based on said decoded address bits and said enable signal to generate a corresponding register file read port output bit.

23. The system as claimed in claim 22, wherein each selector device comprises a n:1 multiplexer logic device for simultaneously receiving said read port data values on said local read bit lines, said system further comprising:
a selector means associated with each n:1 multiplexer logic device for selecting one of said local bit line data values as a corresponding register file read port output bit of a corresponding multiplexer logic device based on said generated decoded address bit signals and said enable signal.

24. The system as claimed in claim 23, further comprising at said receiver device:
a local bit line pre-charge circuit for pre-charging each said local read bit line;
a corresponding first pass gate transistor connected to a corresponding said local bit line activated to select a respective one local bit line data value as said register file read port output bit, and
a corresponding second pass gate transistor connected to a corresponding said first pass gate transistor for controlling output of said register file read port output bit value responsive to said associated selector means.

25. The system as claimed in claim 24, wherein said associated selector means comprises:
a respective address decoder associated with a corresponding multiplexer logic device, said address decoder providing said decoder address signals for activating said second pass gate transistor to control output of said register file port output bit value at said receiver.

* * * * *